(12) United States Patent
Sandhu et al.

(10) Patent No.: US 7,276,752 B2
(45) Date of Patent: Oct. 2, 2007

(54) METHODS OF FORMING INTEGRATED CIRCUITS, AND DRAM CIRCUITRY MEMORY CELLS

(75) Inventors: Gurtej S. Sandhu, Boise, ID (US); Chandra Mouli, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 110 days.

(21) Appl. No.: 11/255,613

(22) Filed: Oct. 21, 2005

(65) Prior Publication Data

US 2006/0040455 A1 Feb. 23, 2006

Related U.S. Application Data

(62) Division of application No. 10/925,079, filed on Aug. 23, 2004, now Pat. No. 7,160,788.

(51) Int. Cl.
*H00L 27/108* (2006.01)

(52) U.S. Cl. ............... 257/296; 257/298; 257/300; 257/E21.653; 257/E21.655

(58) Field of Classification Search ........ 257/295–300, 257/306–311; 438/238–244, 386–387, 253, 438/396
See application file for complete search history.

(56) References Cited

U.S. PATENT DOCUMENTS

| | | | |
|---|---|---|---|
| 5,346,844 A * | 9/1994 | Cho et al. | 438/253 |
| 6,221,708 B1 | 4/2001 | Gonzalez et al. | |
| 6,468,862 B1 | 10/2002 | Gonzalez et al. | |
| 6,958,516 B2 | 10/2005 | Wong | |
| 2003/0022454 A1 * | 1/2003 | Wang et al. | 438/381 |

OTHER PUBLICATIONS

George et al., *Microstructural investigations of light-emitting porous Si layers*, 60 Appl. Phys. Lett. 19, pp. 2359-23615 (May 11, 1992).
Pagonis et al., *Implantation masking technology for selective porous silicon formation*, 197 Phys. Stat. Sol. (a) 1, pp. 241-245 (2003).
Seidel et al., *Anisotropic Etching of Crystalline Silicon in Alkaline Solutions, II. Influence of Dopants*, 137 J. Electrochem. Soc. 11, pp. 3626-3632 (Nov. 1990).
Smith et al., *Porous silicon formation mechanisms*, 71 J. Appl. Phys. 8, pp. R1-R22 (Apr. 15, 1992).

* cited by examiner

*Primary Examiner*—Dung A. Le
(74) *Attorney, Agent, or Firm*—Wells St. John P.S.

(57) ABSTRACT

This invention includes methods of forming integrated circuits, and includes DRAM circuitry memory cells. In one implementation, a method of forming an integrated circuit includes forming a trench isolation mask over a semiconductor substrate. The trench isolation mask defines an active area region and a trench isolation region. An ion implantion is conducted into semiconductive material of the substrate to form a buried region within active area of the substrate. The buried region has a first edge received proximate an edge of the trench isolation region. Using the trench isolation mask, etching is conducted into semiconductive material of the substrate to form an isolation trench. After the ion implantation and after forming the isolation trench, insulative material is formed within the buried region and insulative material is deposited to within the isolation trench. The insulative material received within the isolation trench joins with the insulative material formed within the buried region.

25 Claims, 15 Drawing Sheets

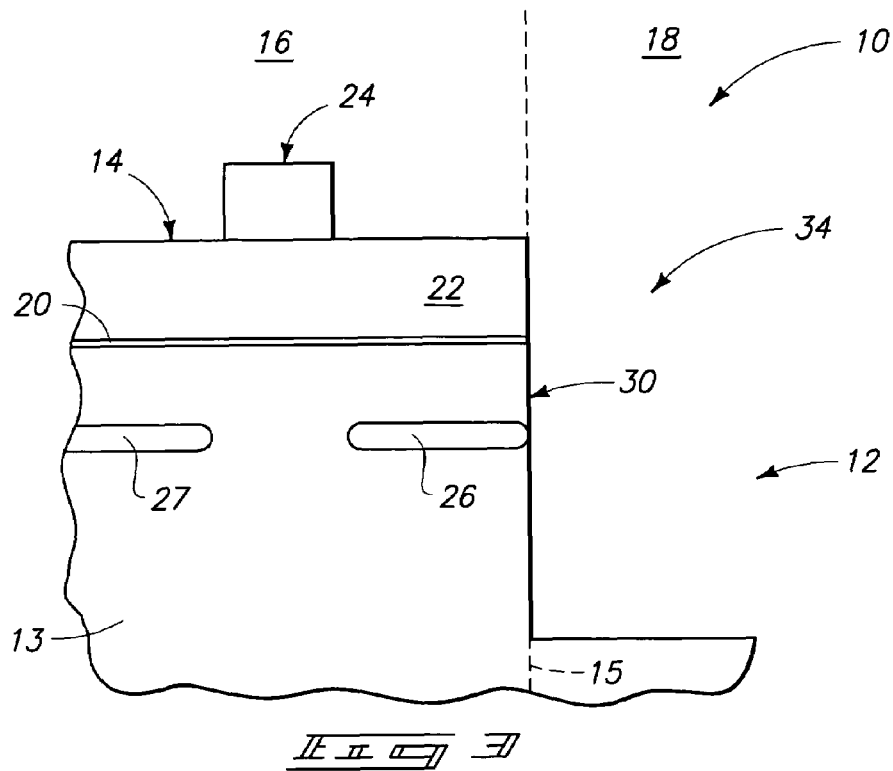
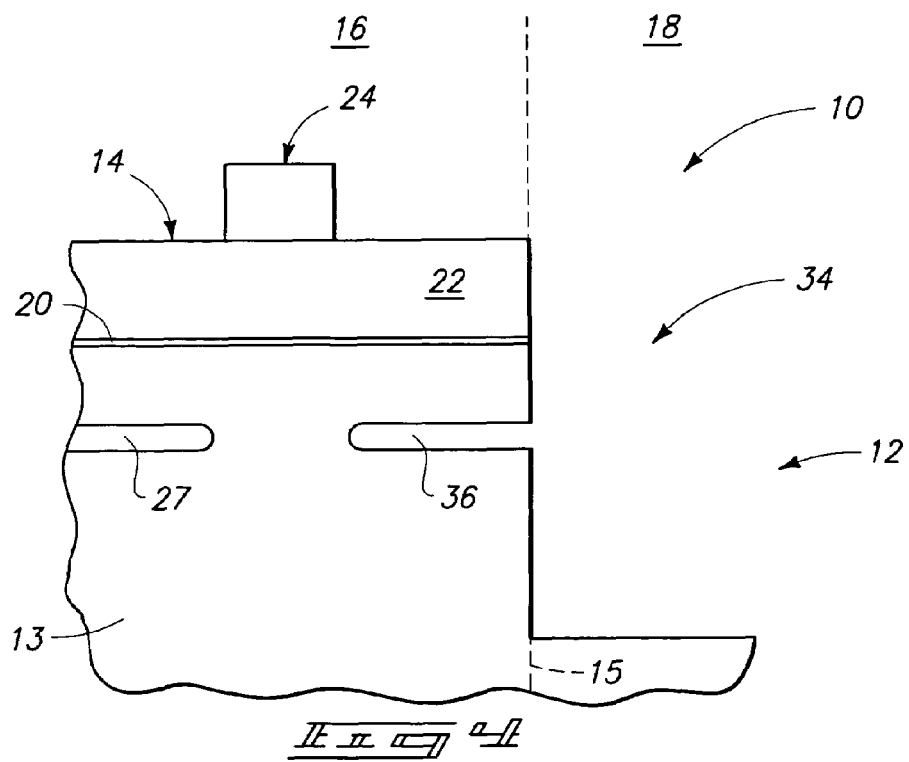

METHODS OF FORMING INTEGRATED CIRCUITS, AND DRAM CIRCUITRY MEMORY CELLS

This patent resulted from a divisional application of U.S. patent application Ser. No. 10/925,079, filed Aug. 23, 2004, now U.S. Pat. No. 7,160,788, entitled "Methods of Forming Integrated Circuits, and DRAM Circuitry Memory Cells", naming Gurtej S. Sandhu and Chandra Mouli as inventors, the disclosure of which is incorporated by reference.

TECHNICAL FIELD

This invention relates to methods of forming integrated circuits, and to DRAM circuitry memory cells.

BACKGROUND OF THE INVENTION

Dynamic random access memory circuitry (DRAM) is comprised of a plurality of individual memory cells. Individual cells comprise an access transistor, a capacitor and conductive access to a bit line. One source/drain region of the access transistor electrically connects with the capacitor, with the other source/drain of the access transistor electrically connecting with the bit line. Once set, the storage node of the capacitor is not able to maintain charge due to current leakage through the source/drain region to which it is connected to substrate material therebelow. Such requires charge refreshing of a charged memory cell to maintain its desired memory state. The time between the capacitor recharging is known as "refresh time" or "retention time". One adverse phenomenon is known as "variable retention time". Such results in the refresh time for individual DRAM capacitors varying over time, sometimes increasing and sometimes decreasing.

It is desirable to create good electrical connection between the storage node electrode of the capacitor and the source/drain region which is typically formed of conductively doped semiconductive material. One manner of doing so is to provide a metal interface between the capacitor storage node and the conductively doped semiconductive material. Such contacts significantly improve electrical connection between source/drains and capacitor storage nodes. However, such also tend to significantly increase leakage current to the underlying substrate material. One known manner of reducing such leakage current is to provide an insulative layer beneath the active area within which the source/drain regions and channel regions are formed.

While the invention was motivated in addressing the above identified issues, it is in no way so limited. The invention is only limited by the accompanying claims as literally worded, without interpretative or other limiting reference to the specification, and in accordance with the doctrine of equivalents.

SUMMARY

This invention comprises methods of forming integrated circuits, and comprises DRAM circuitry memory cells. In one implementation, a method of forming an integrated circuit includes forming a trench isolation mask over a semiconductor substrate. The trench isolation mask defines an active area region and a trench isolation region. Ion implanting is conducted into semiconductive material of the substrate to form a buried region within active area of the semiconductor substrate. The buried region has a first edge received proximate an edge of the trench isolation region. Using the trench isolation mask, etching is conducted into semiconductive material of the semiconductor substrate to form an isolation trench. After the ion implanting and after forming the isolation trench, insulative material is formed within the buried region and insulative material is deposited to within the isolation trench. The insulative material received within the isolation trench joins with the insulative material formed within the buried region.

In one implementation, a method of forming an integrated circuit includes forming an isolation trench within semiconductive material of a semiconductor substrate. A buried void is formed to extend laterally from an edge of the isolation trench to within the semiconductive material. Insulative material is deposited to within the isolation trench including into the buried void effective to fill at least the buried void.

In one implementation, a DRAM circuit memory cell includes a substrate comprising semiconductive material. A bit line is received over the substrate. A capacitor is received over the substrate, with the capacitor comprising a storage electrode and a cell electrode. A field effect transistor comprising a word line is received over the substrate. The field effect transistor comprises one source/drain region in electrical connection with the capacitor storage electrode and another source/drain region in electrical connection with the bit line. In one aspect, the substrate comprises an insulative layer received beneath the another source/drain region, with the another source/drain region comprising conductive metal which extends from the insulative layer to the bit line. In one aspect, the substrate comprises an insulative layer received beneath the another source/drain region, with the another source/drain region comprising conductive metal which extends from the insulative layer to the bit line.

Other aspects and implementations are contemplated.

BRIEF DESCRIPTION OF THE DRAWINGS

Preferred embodiments of the invention are described below with reference to the following accompanying drawings.

FIG. 3 is a view of the FIG. 2 substrate fragment at a processing step subsequent to that depicted by FIG. 2.

FIG. 4 is a view of the FIG. 3 substrate fragment at a processing step subsequent to that depicted by FIG. 3.

FIG. 21 is a diagrammatic sectional view of another substrate fragment in process in accordance with an aspect of the invention.

DETAILED DESCRIPTION OF THE PREFERRED EMBODIMENTS

This disclosure of the invention is submitted in furtherance of the constitutional purposes of the U.S. Patent Laws "to promote the progress of science and useful arts" (Article 1, Section 8).

Figure 1:
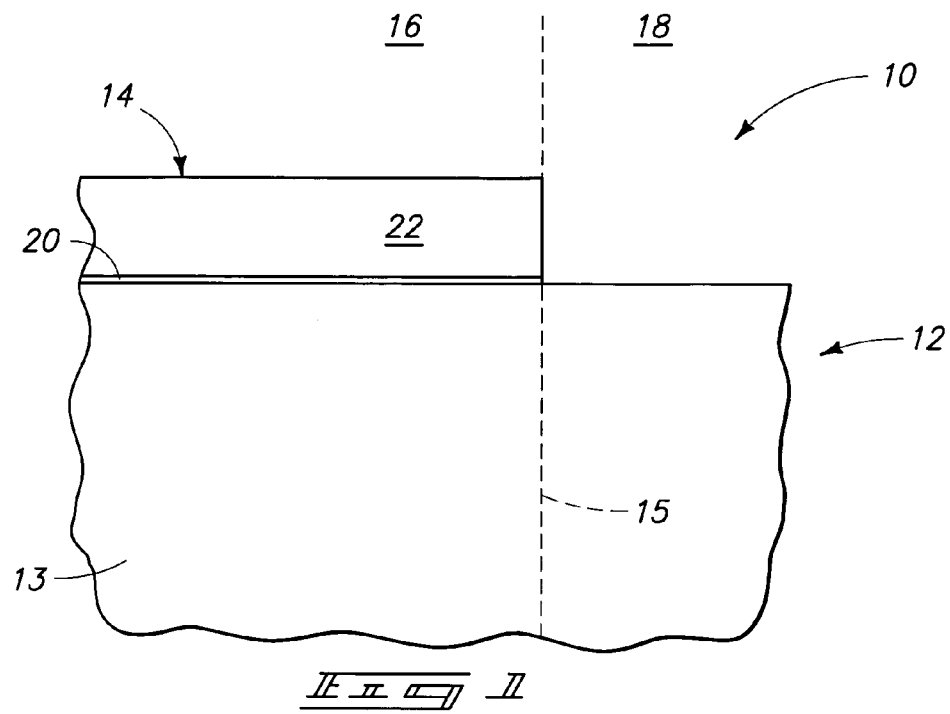
FIG. 1 is a diagrammatic sectional view of a substrate fragment in process in accordance with an aspect of the invention.

Some preferred aspects of methods of forming an integrated circuit are described initially with reference to FIGS. 1-7. Referring initially to FIG. 1, a substrate fragment is indicated generally with reference numeral 10 and comprises a semiconductor substrate 12 comprising semiconductive material 13. In the context of this document, the term "semiconductor substrate" or "semiconductive substrate" is defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above. In one preferred embodiment, semiconductor substrate 12 comprises silicon, for example bulk monocrystalline silicon. The invention was principally motivated in connection with leakage current issues manifesting in bulk integrated circuit fabrication, although semiconductor-on-insulator substrates are also contemplated.

A trench isolation mask 14 is formed over semiconductor substrate 12. Such generally defines an active area region 16 and a trench isolation region 18. By way of example only, the depicted trench isolation mask 14 comprises a pad oxide layer 20 and an overlying silicon nitride layer 22.

Figure 2:
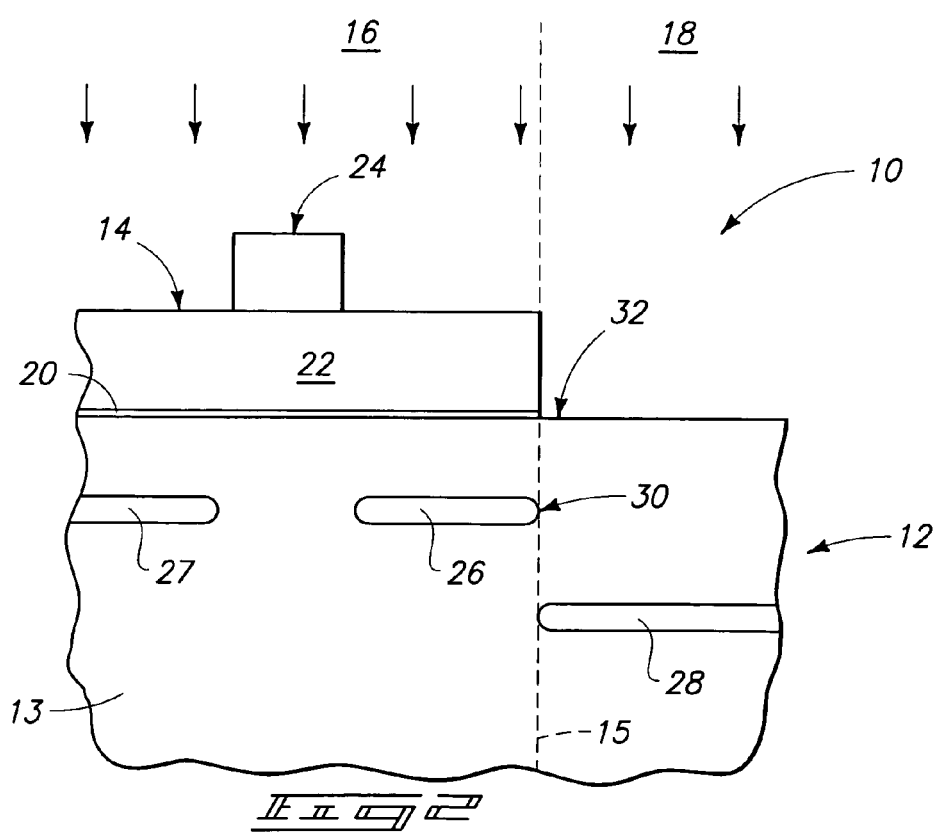
FIG. 2 is a view of the FIG. 1 substrate fragment at a processing step subsequent to that depicted by FIG. 1.

Referring to FIG. 2, an ion implant mask 24 has been formed over trench isolation mask 14. Ion implanting has been conducted into semiconductive material 13 of semiconductor substrate 12 to form a buried region 26 within active area 16 of semiconductor substrate 12. Buried regions 27 and 28 are also formed as shown. In the depicted exemplary embodiment, both ion implant mask 24 and trench isolation mask 14 are used during the depicted ion implanting, for example as indicated by the vertically downward-directed arrows. However, the invention also contemplates utilizing only one or neither of the depicted masks 24 and 14, as will be apparent in the continuing discussion.

Trench isolation region 18 can be considered as comprising an edge 15. Buried region 26 has a first edge 30 which is received proximate trench isolation region edge 15, and in the depicted preferred embodiment, is essentially coincident therewith. In one preferred embodiment, buried region 26 has a peak implant concentration which is spaced at least 100 Angstroms from an upper surface 32 of semiconductive material 13 of semiconductor substrate 12, and, more preferably, spaced from 200 Angstroms to 600 Angstroms from such upper surface. In one preferred implementation, the ion implanting is with a material that is inert to chemical reaction with semiconductive material 13 of substrate 12. By way of example only, example preferred materials include conductivity enhancing or modifying dopants, for example B, P, or As, including mixtures thereof. Further and regardless, in one preferred embodiment, the ion implanting is of a material that is void of having any conductivity enhancing effect relative to semiconductive material 13. In one exemplary such preferred embodiment, an exemplary material comprises oxygen atoms or molecules, for example, which may or may not, due to the implant, form silicon dioxide if material 13 comprises silicon. Yet in another specific preferred implementation, n-type dopants such as P and/or As may be implanted into p-type silicon substrates.

Regardless, and by way of example only, an exemplary implant dose is from $1 \times 10^{11}$ to $1 \times 10^{16}$ atoms or ions/cm², with an edge of an implant region comprising that laterally outermost location where implant material concentration becomes $1 \times 10^{17}$ to $1 \times 10^{22}$ atoms or ions/cm³ and greater. In one implementation, the implanting forms buried region 26 to constitute a damage region enabling anodic etching substantially selectively relative to surrounding substrate material 13. For example, and by way of example only, where material 13 comprises silicon, the damage region might form porous silicon, which can be oxidized substantially selectively relative to surrounding substrate material 13, or selectively anodically etched.

Referring to FIG. 3, semiconductive material 13 of semiconductor substrate 12 has been etched into to form an isolation trench 34 at least using trench isolation mask 14. The FIG. 2 depicted buried implant region 28 has been etched through in the exemplary FIG. 3 embodiment.

Figure 5:
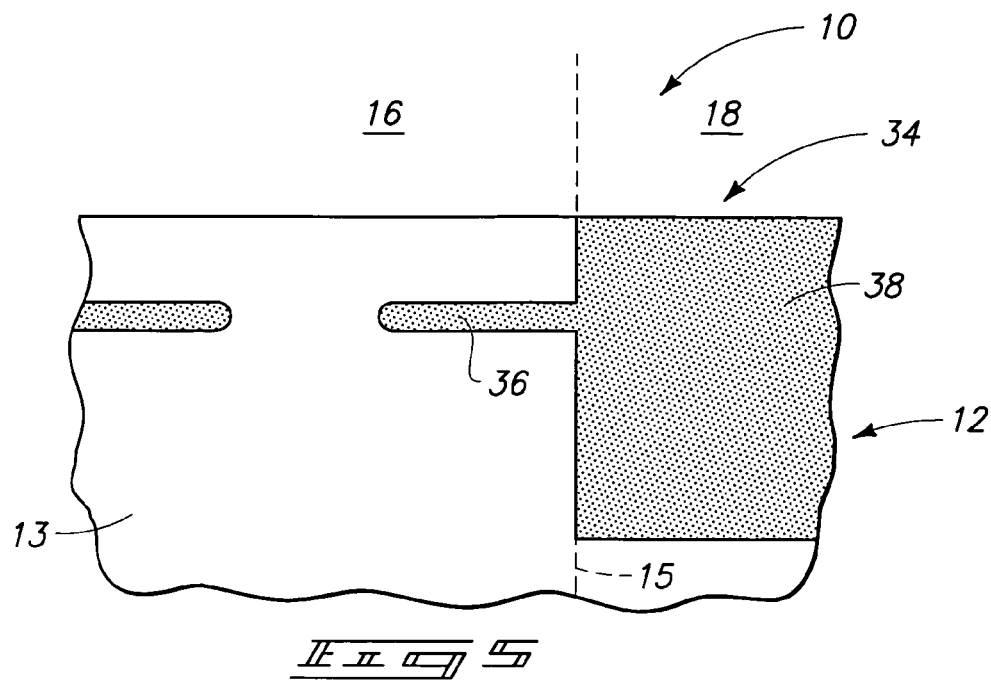
FIG. 5 is a view of the FIG. 4 substrate fragment at a processing step subsequent to that depicted by FIG. 4.

After the ion implanting and after forming the isolation trench, insulative material is formed within the buried region and insulative material is deposited to within the isolation trench. The insulative material received within the isolation trench joins with the insulative material formed within the buried region. By way of example only, FIGS. 4 and 5 depict one exemplary preferred method of such processing. Referring to FIG. 4, material of buried region 26 has been etched from the substrate through trench isolation region edge 15 effective to form a buried void 36 extending laterally through trench isolation region edge 15 into active area 16. By way of example only, preferred techniques for doing so are wet etching and anodic etching.

For example for wet etching an implanted region comprising oxygen and/or oxide formation therefrom and where material 13 comprises bulk monocrystalline silicon, an example wet etching chemistry comprises an aqueous HF solution. Further for example where n-type dopants such as P and/or As have been implanted into p-type silicon material, exemplary techniques for anodic etching include those employed in fully isolated porous oxided silicon (FIPOS) technologies. Specifically where material 13 comprises bulk monocrystalline silicon, an example electrolytic chemical anodizing solution is a 1:1 dilution of a 49 weight percent HF solution in de-ionized water, for example, by controlling the potential at less than about 0.1 Volt so as to form pores preferentially in n+ silicon relative to surrounding p+ and/or p− silicon, with the bath being at an exemplary temperature range from 10° C. to 50° C. and at room ambient pressure, and etches such porous material.

Referring to FIG. 5, masks 14 and 24 have been removed, and insulative material 38 has been deposited to within isolation trench 34, with at least some of such insulative material 38 also depositing to within buried void 36. A preferred technique is by high density plasma deposition of silicon dioxide, although the fabrication of any insulative material is contemplated. Such provides one example of forming insulative material within buried region 26 and depositing insulative material to within isolation trench 34, with insulative material received within the isolation trench joining with insulative material formed within the buried region. The insulative materials within what was void 36 and that within trench 34 might, of course, be the same or different, as well as being formed at the same or different times. For example in one implementation, the ion implanting as referred to above might comprise oxygen atoms which, upon implanting and/or in combination with a subsequent anneal, form an oxide material of buried region 26. Alternately by way of example as shown, buried region 26 might be removed to at least some degree and substituted with insulative material separately deposited or formed from the removal. Alternately by way of example only, region 26 might be formed to comprise an insulative material such as oxide during deposition or by a dedicated oxidizing step where oxygen atoms are either present or provided within region 26. In one exemplary preferred embodiment, at least some of the insulative material formed within buried region 26 is of the same composition as insulative material 38 deposited within isolation trench 34.

In one exemplary embodiment, the invention contemplates forming insulative oxide within buried void 36, for example by a deposition technique or a thermal growth technique. Such oxide might remain or be removed prior to the deposition of trench filling oxide 38. By way of example only, an exemplary reason for oxidizing internal portions of void 36 followed by subsequent removal of the oxide so formed might be to round the internal corners of void 36. In such instance, the formed oxide might be removed as being less desirable than the oxide 38 deposited by, for example, high density plasma deposition.

Figure 6:
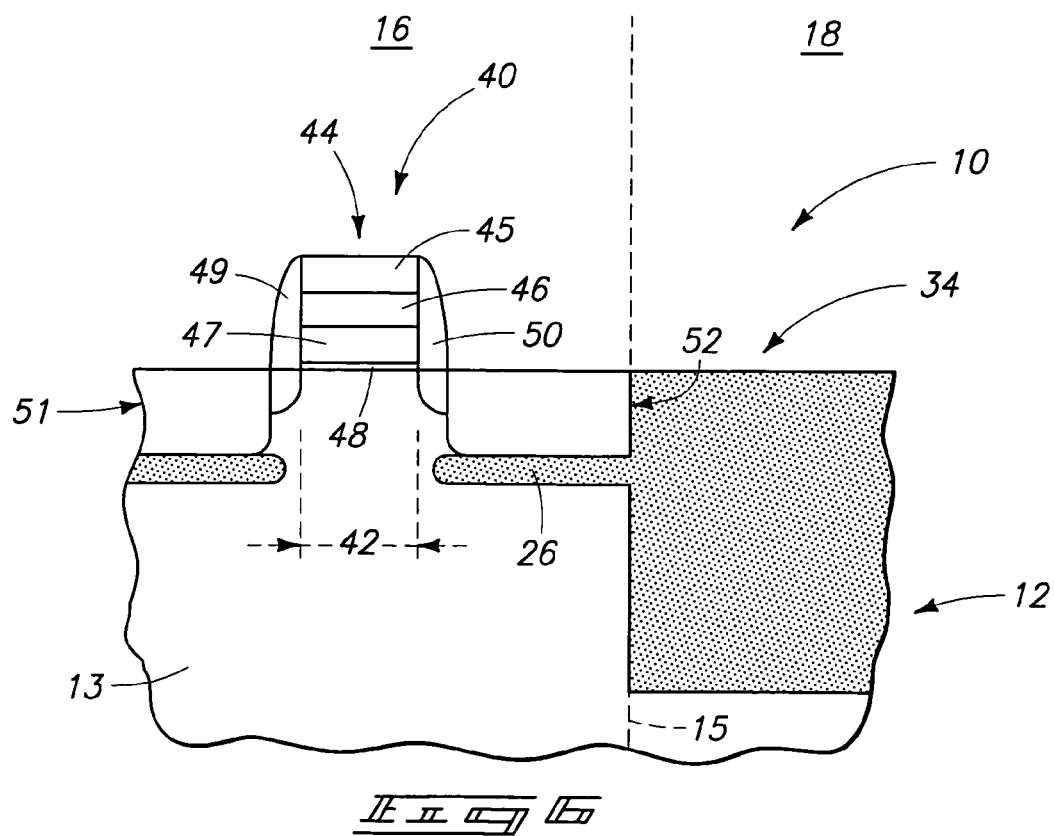
FIG. 6 is a view of the FIG. 5 substrate fragment at a processing step subsequent to that depicted by FIG. 5.

Referring to FIG. 6, a field effect transistor 40 has been formed within active area 16. Such comprises a channel region 42 comprising semiconductive material 13 of active area 16. In the depicted preferred embodiment, no part of buried region 26 is received beneath channel region 42. Field effect transistor 40 comprises a gate 44 which, by way of example only, is depicted as comprising an insulative layer 45 received over a metal or metal silicide layer 46, which is received over a conductively doped polysilicon layer 47, which is received over a gate dielectric layer 48. Insulative sidewall spacers 49 and 50 are formed as part of gate construction 44, and source/drain regions 51 and 52 are formed on opposing sides of channel region 42.

Figure 7:
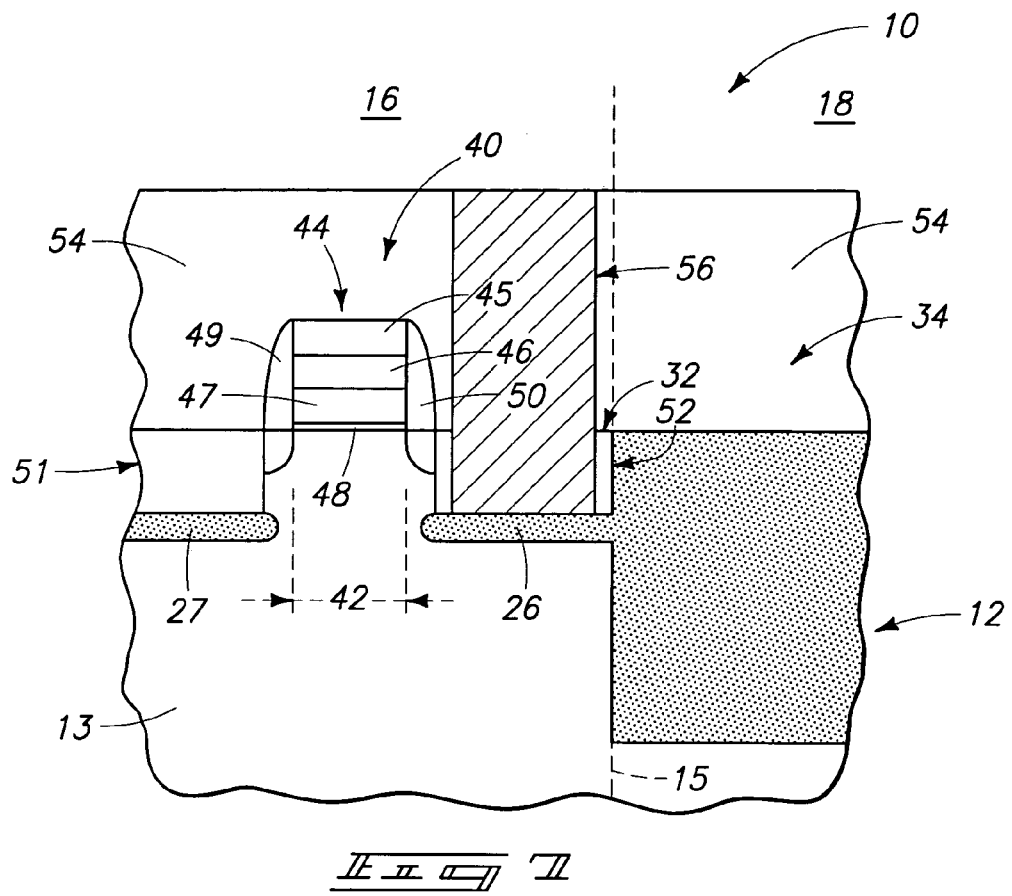
FIG. 7 is a view of the FIG. 6 substrate fragment at a processing step subsequent to that depicted by FIG. 6.

Referring to FIG. 7, a dielectric layer 54 has been deposited over the substrate, with an exemplary material being borophosphosilicate glass (BPSG). An opening 56 has been formed therein to insulative material 38 of buried region 26. Such has been filled with conductive metal, with such electrically conductive metal thereby in the depicted preferred embodiment extending from contacting insulative material 38 of buried region 26 to outwardly of upper surface 32 of semiconductive material 13. In the context of this document, a "metal" is one or a combination of an elemental form metal, an alloy of elemental form metals, or one or more metal compounds, including mixtures thereof.

Figure 8:
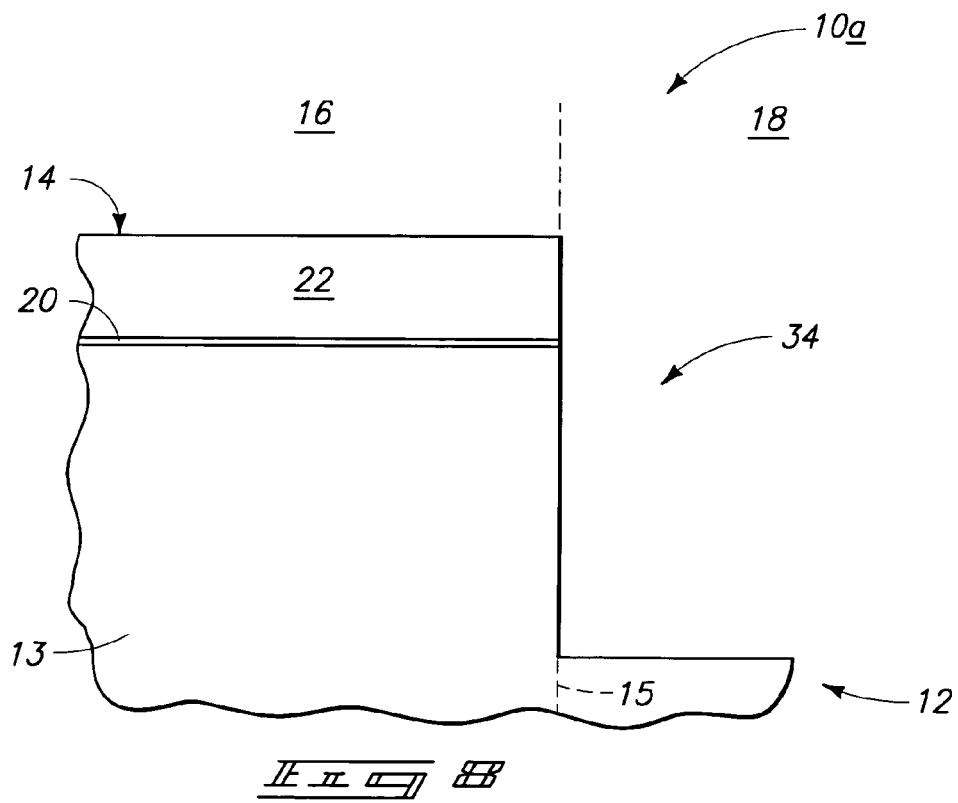
FIG. 8 is a diagrammatic sectional view of another substrate fragment in process in accordance with an aspect of the invention.

The above exemplary processing depicts the ion implanting as being conducted before the etching to form the isolation trench. The invention also, of course, contemplates conducting the ion implanting after the etching to form the isolation trench, for example as depicted in FIG. 8 with respect to a substrate fragment 10a. Like numerals from the first described embodiment are utilized where appropriate, with differences being indicated with the suffix "a". FIG. 8 depicts the trench etching of substrate fragment 10a as having occurred relative to trench isolation mask 14 prior to the fabrication of a buried ion implant region. Accordingly, one or more buried ion implant regions could be formed subsequent to the processing depicted by FIG. 8, and processing otherwise conducted subsequent thereto as described above, or otherwise.

Figure 9:
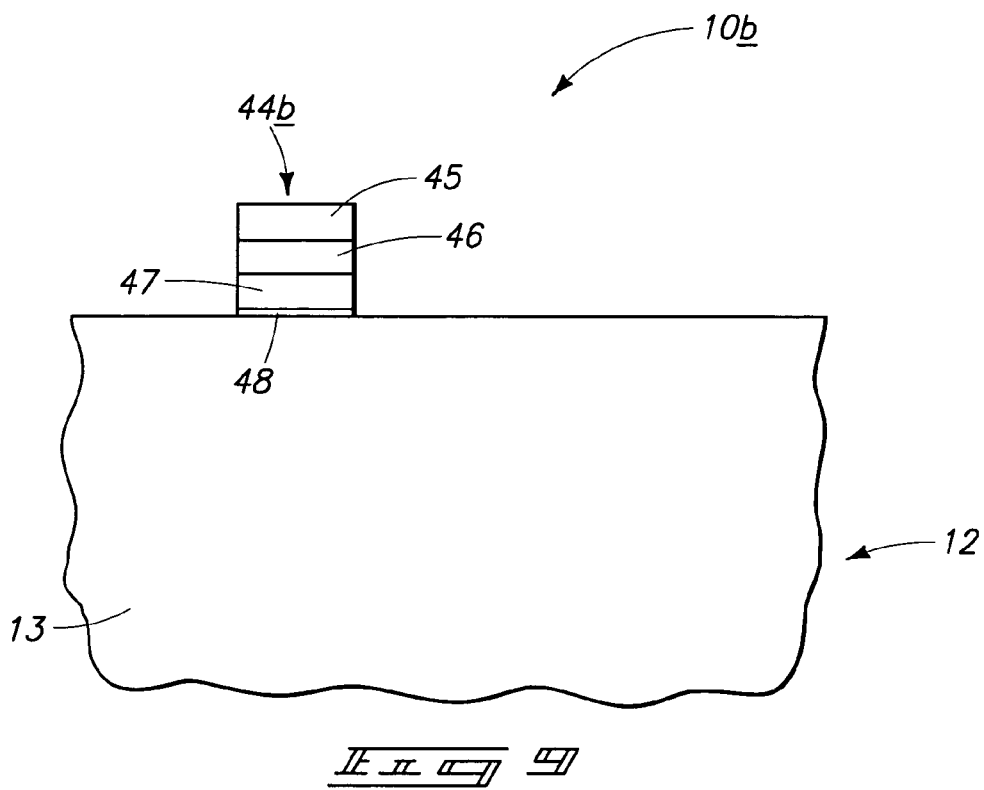
FIG. 9 is a diagrammatic sectional view of another substrate fragment in process in accordance with an aspect of the invention.

The above processing also depicts forming the field effect transistor gate 44 after forming the insulative material within buried region 26, and after depositing insulative material 38 to within isolation trench 34. However, the invention also contemplates forming a field effect transistor gate prior to forming even the trench isolation mask wherein the trench isolation mask is subsequently formed over the gate, for example as described in connection with FIGS. 9-12. Such depicts an alternate embodiment semiconductor substrate fragment 10b. Like numerals from the first described embodiment are utilized where appropriate, with differences being indicated with the suffix "b" or with different numerals. Referring initially to FIG. 9, substrate fragment 10b depicts a field effect transistor gate 44b fabricated prior to the formation of an isolation trench.

Figure 10:
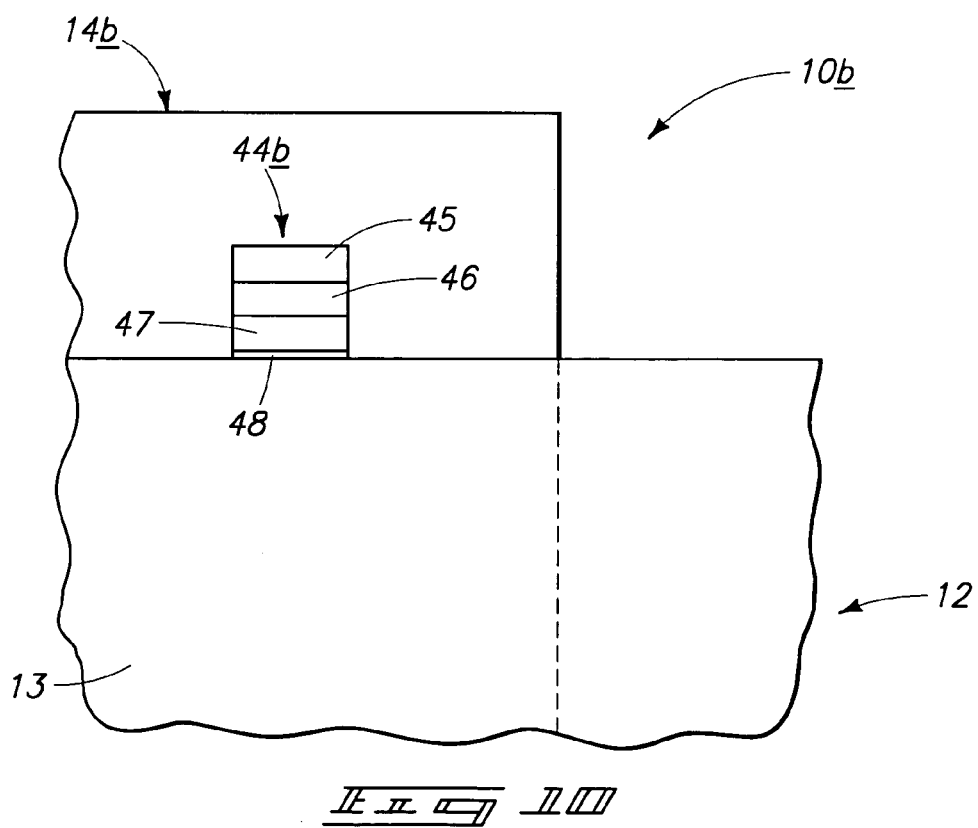
FIG. 10 is a view of the FIG. 9 substrate fragment at a processing step subsequent to that depicted by FIG. 9.

Referring to FIG. 10, a trench isolation mask 14b has been formed over semiconductor substrate 12, including over gate 44b.

Figure 11:
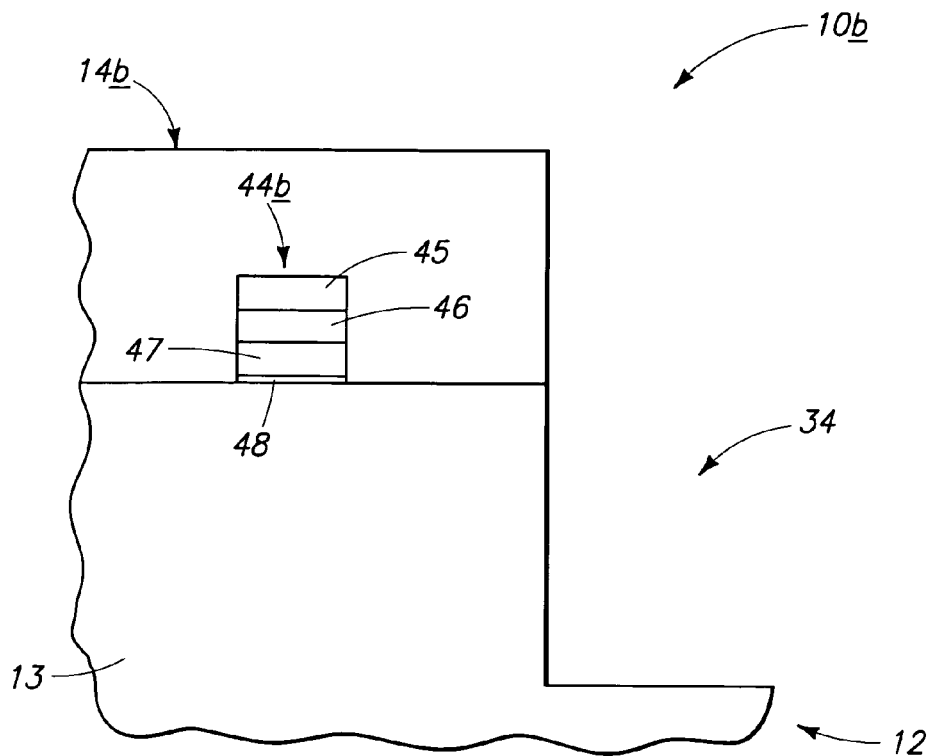
FIG. 11 is a view of the FIG. 10 substrate fragment at a processing step subsequent to that depicted by FIG. 10.

Referring to FIG. 11, an isolation trench 34 has been etched into semiconductive material 13 of semiconductor substrate 12 using trench isolation mask 14b.

Figure 12:
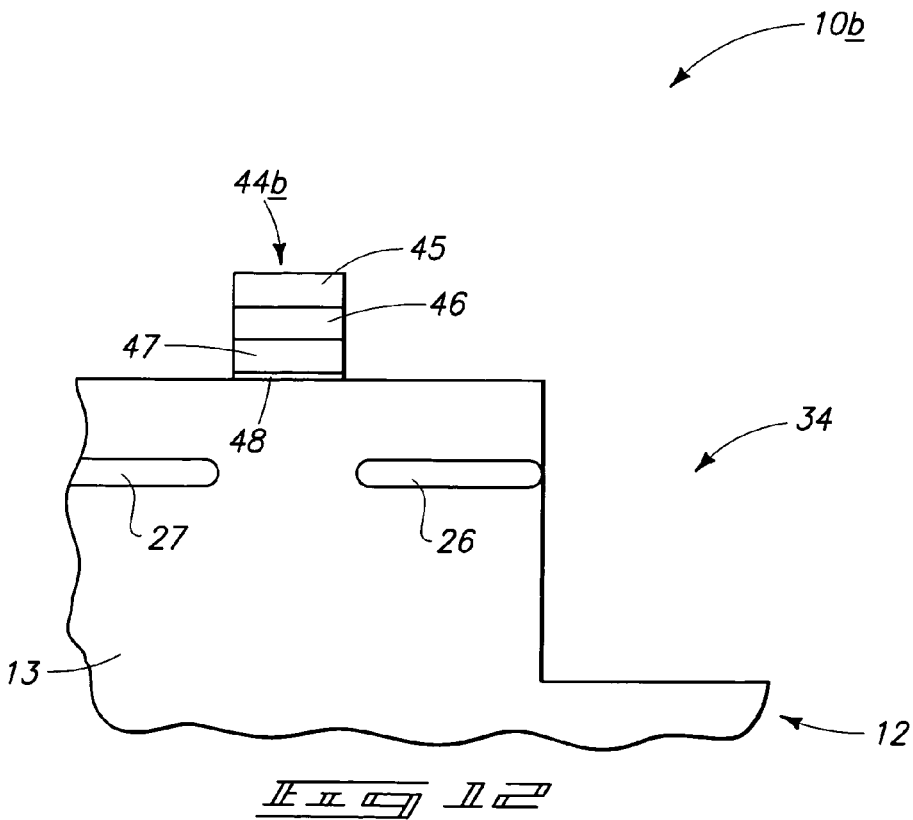
FIG. 12 is a view of the FIG. 11 substrate fragment at a processing step subsequent to that depicted by FIG. 11.

Referring to FIG. 12, trench isolation mask 14b has been removed from over semiconductor substrate 12, and ion implanting has been conducted to form buried ion implant regions 26 and 27. Accordingly in such exemplary preferred embodiment, such ion implanting has been conducted after the etching to form isolation trench 34 and, as well, trench isolation mask 14b has been removed from substrate 12 prior to such ion implanting. Accordingly, and by way of example only, the FIGS. 9-12 processing depicts an exemplary embodiment whereby ion implanting to form the recited buried region has occurred without using any portion of the trench isolation mask as a mask during such ion implanting. Further, FIGS. 9-12 provide an example whereby buried region 26 is formed essentially self-aligned between the edge of the trench and the edge of the gate construction. Further by way of example only, other portions of the substrate (including for example isolation trench 34) may be protected by a mask during this ion implanting step.

In one aspect, the invention contemplates a method of forming an integrated circuit (which may or may not include DRAM circuitry) which includes forming an isolation trench within semiconductive material of a semiconductor substrate. By way of example only, trench 34 in the above-described embodiments is an example of such a trench formed within semiconductive material 13 of a semiconductor substrate 12. A buried void is formed to extend laterally from an edge of the isolation trench to within the semiconductive material. By way of example only, buried void 36 in the above-described embodiments is but one example. Insulative material is deposited to within the isolation trench, including into the buried void effective to fill at least the buried void. By way of example only, material 38 is one such exemplary material and depositing. Other attributes as described above are preferably also utilized.

Figure 13:
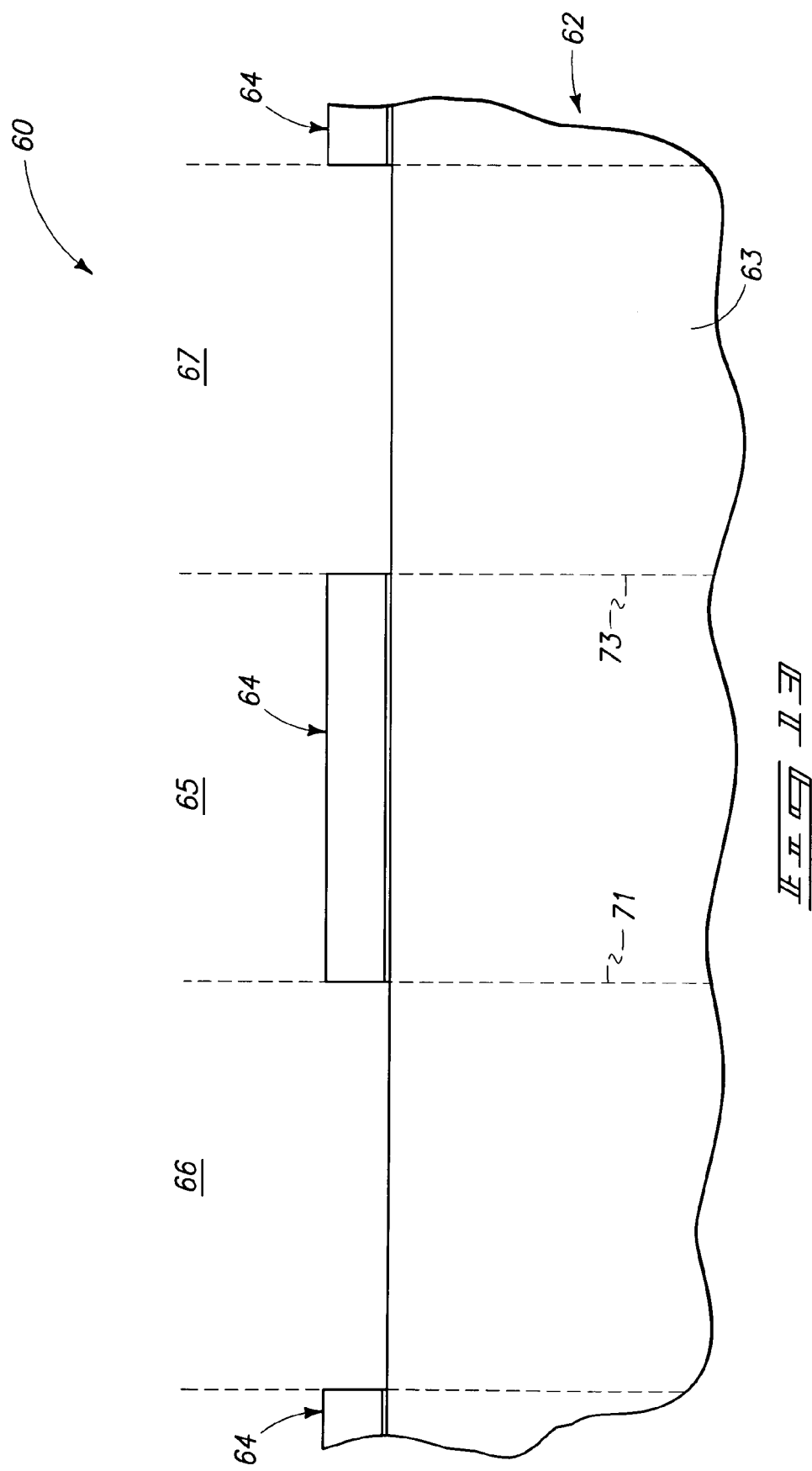
FIG. 13 is a diagrammatic sectional view of another substrate fragment in process in accordance with an aspect of the invention.

Aspects of the invention contemplate methods of forming an integrated circuit comprising DRAM circuitry, although any integrated circuit is contemplated. By way of example only, additional aspects of the invention are described with reference to FIGS. 13-21, which also, in one implementation, contemplate the fabrication of DRAM circuitry. FIG. 13 depicts a substrate fragment 60 comprising a semiconductor substrate 62 comprising semiconductive material 63. A trench isolation mask 64 is formed over semiconductor substrate 62. Preferred attributes of such materials are otherwise as described above in connection with the first described embodiment. Trench isolation mask 64 defines an active area 65 received intermediate first and second trench isolation regions 66 and 67, respectively, and trench isolation region edges 71 and 73.

Figure 14:
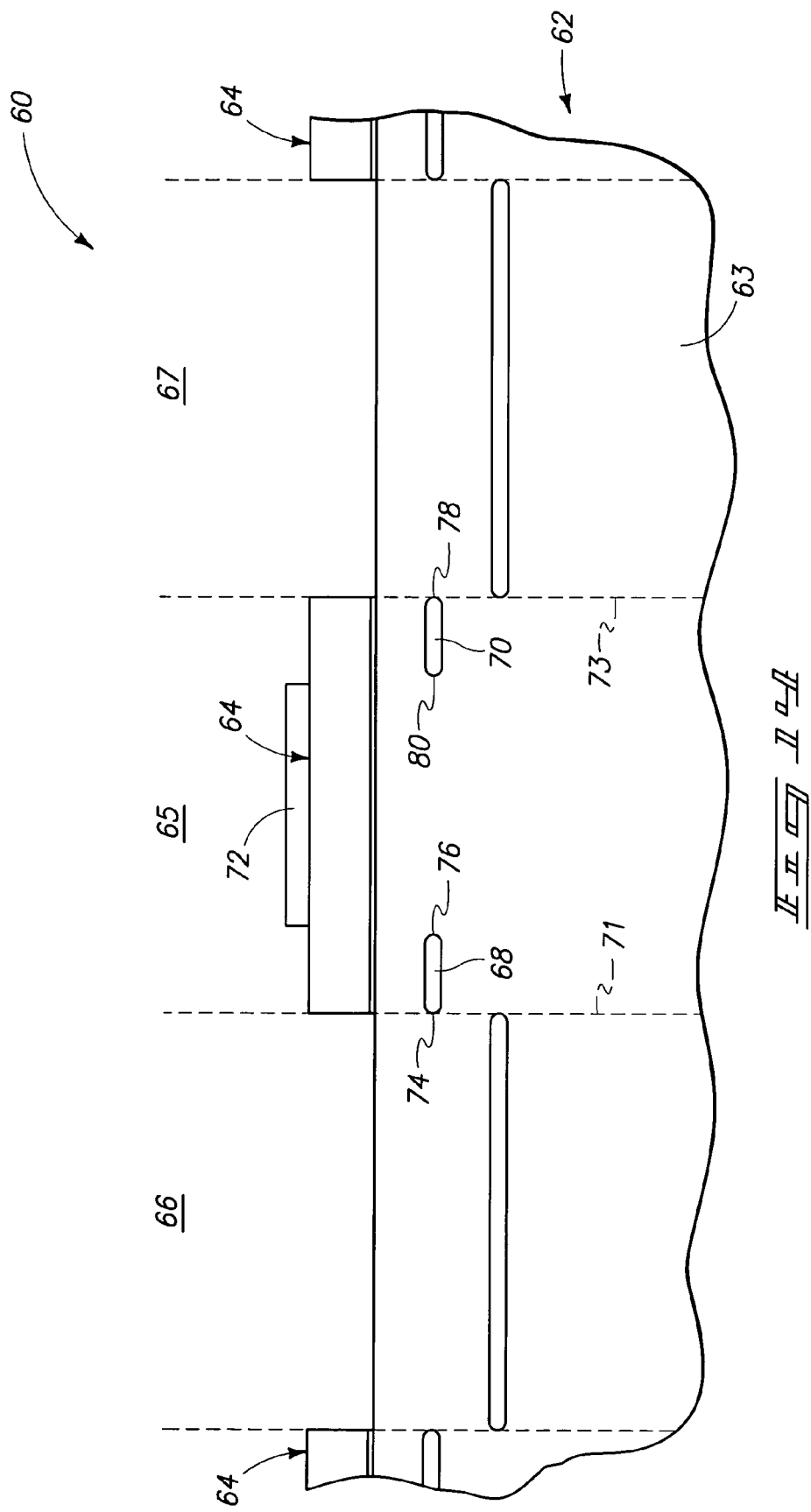
FIG. 14 is a view of the FIG. 13 substrate fragment at a processing step subsequent to that depicted by FIG. 13.

Referring to FIG. 14, ion implanting has been conducted into semiconductive material 63 of substrate 62 to form first and second buried regions 68 and 70, respectively, within active area 65 of semiconductor substrate 62 using trench isolation mask 64. In the depicted preferred embodiment, an ion implant mask 72 has also been formed over trench isolation mask 64, with both ion implant mask 72 and trench isolation mask 64 being used during the ion implanting. Preferred attributes of such implanting are otherwise as described above in connection with the first described embodiments. First buried region 68 has a first edge 74 received proximate edge 71 of first trench isolation region 66, and a second edge 76 opposing first buried region first edge 74. Second buried region 70 has a first edge 78 received proximate edge 73 of second trench isolation region 67, and a second edge 80 opposing second buried region first edge 78. Second edges 76 and 80 of first and second buried regions 68 and 70, respectively, are spaced from one another within active area 65.

Figure 15:
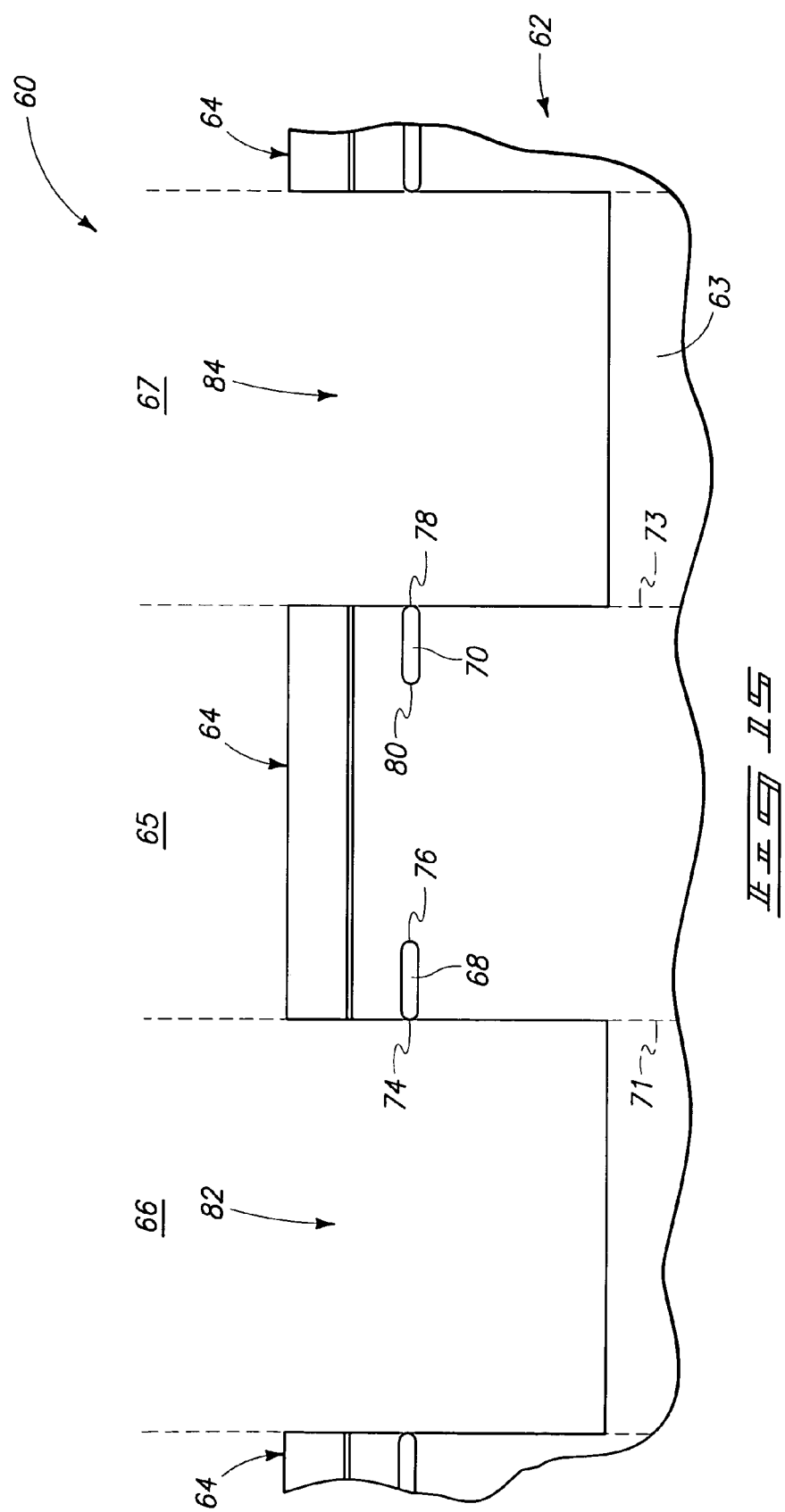
FIG. 15 is a view of the FIG. 14 substrate fragment at a processing step subsequent to that depicted by FIG. 14.

Referring to FIG. 15, after the ion implanting, trench isolation mask 64 has been used as a mask while etching into semiconductive material 63 of semiconductor substrate 62 to form isolation trenches 82 and 84.

Figure 16:
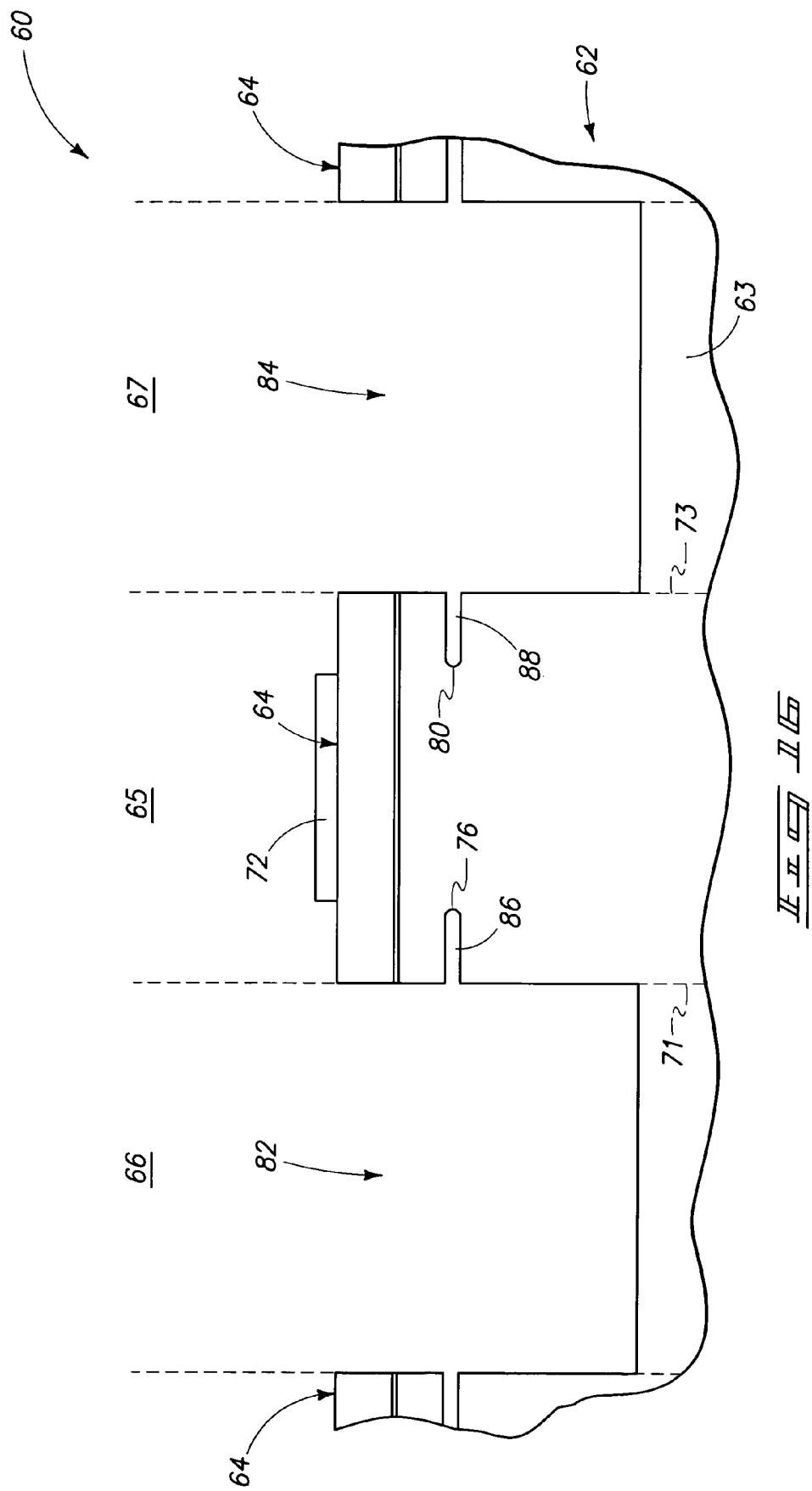
FIG. 16 is a view of the FIG. 15 substrate fragment at a processing step subsequent to that depicted by FIG. 15.

Referring to FIG. 16, buried region material has been etched from first and second buried regions 68 and 70 through first edges 74, 78 and first and second trench isolation region edges 71, 73, respectively, effective to form a first buried void 86 extending laterally from first trench isolation region 66 edge 71 into active area 65, and a second buried void 88 extending laterally from second trench isolation region 67 edge 73 into active area 65. Exemplary processing for such etching is preferably conducted as described above.

Figure 17:
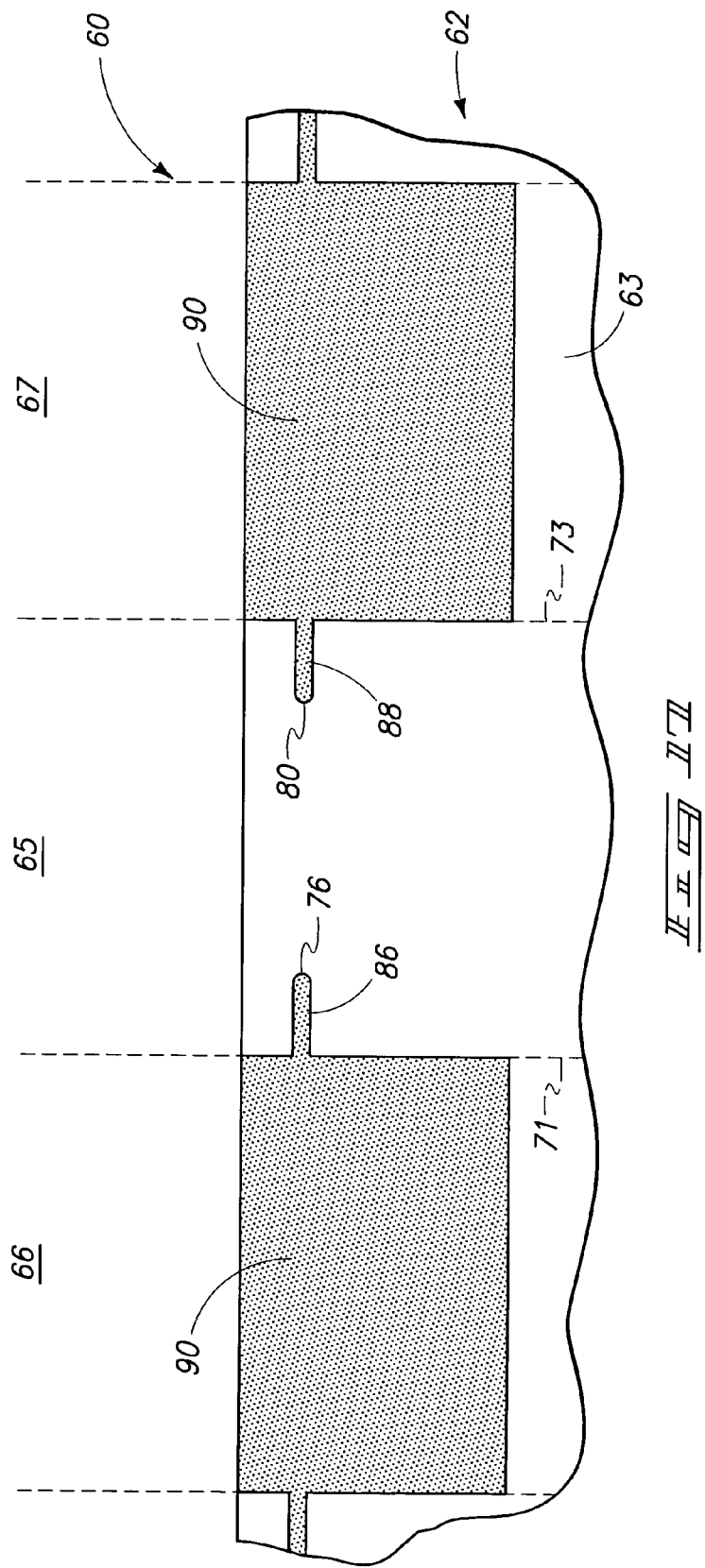
FIG. 17 is a view of the FIG. 16 substrate fragment at a processing step subsequent to that depicted by FIG. 16.

Referring to FIG. 17, insulative material 90 has been deposited to within first and second isolation trenches 82, 84, including into first and second buried voids 86, 88 effective to fill at least first and second buried voids 86 and 88. Of course, processing could otherwise be conducted as described above to form insulative material within the respective buried regions. Such processing also, by way of example only, depicts and describes trench etching being conducted to form multiple isolation trenches, and wherein the buried region comprises a second edge opposite the first stated edge, with the second edge being spaced from a next adjacent of the isolation trenches.

Figure 18:
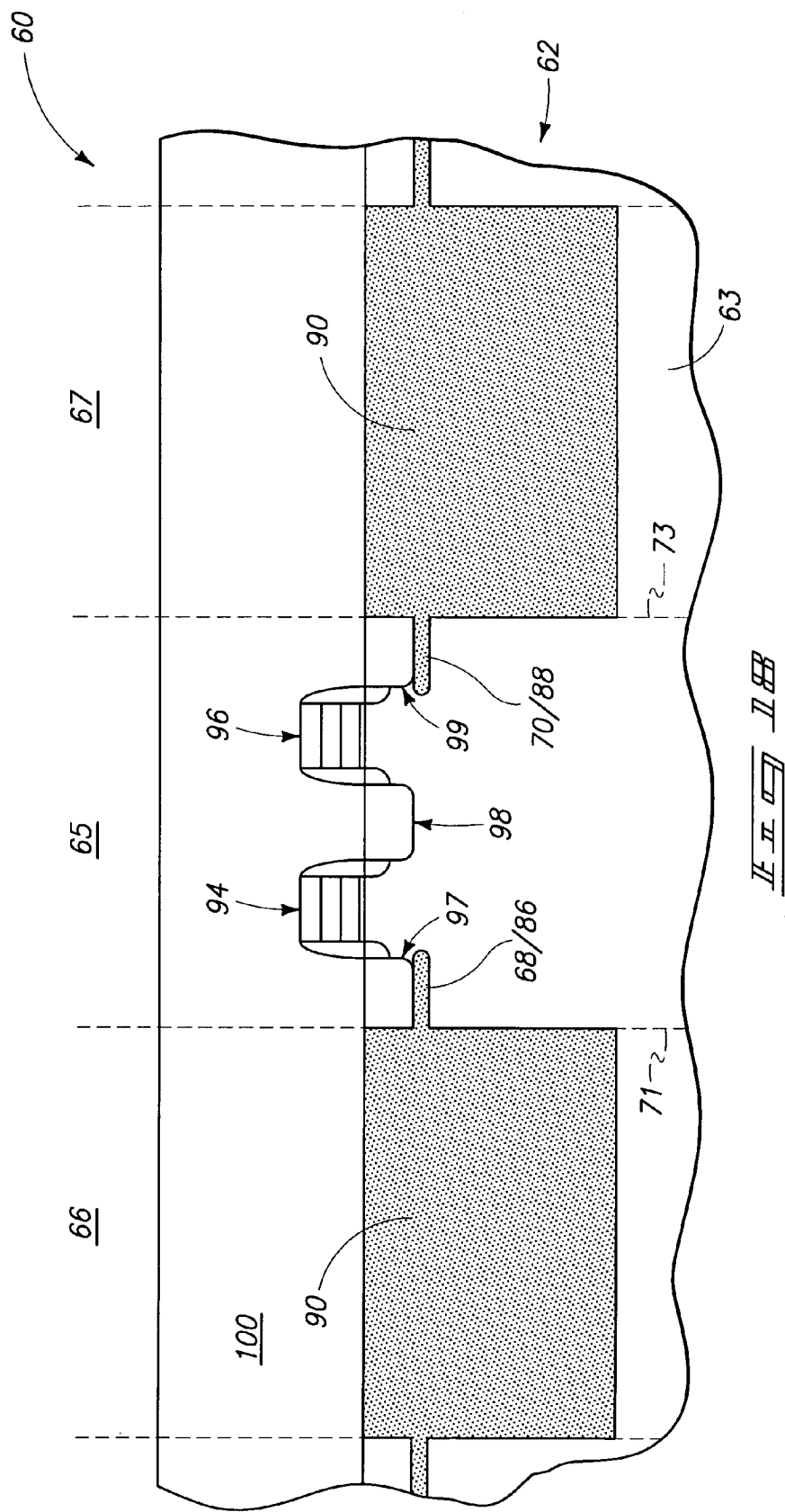
FIG. 18 is a view of the FIG. 17 substrate fragment at a processing step subsequent to that depicted by FIG. 17.

Referring to FIG. 18, field effect transistor gate constructions 94 and 96, as well as source/drain regions 97, 98 and 99, have been fabricated. A planarized insulative dielectric layer 100, for example BPSG, has been formed thereover.

Figure 19:
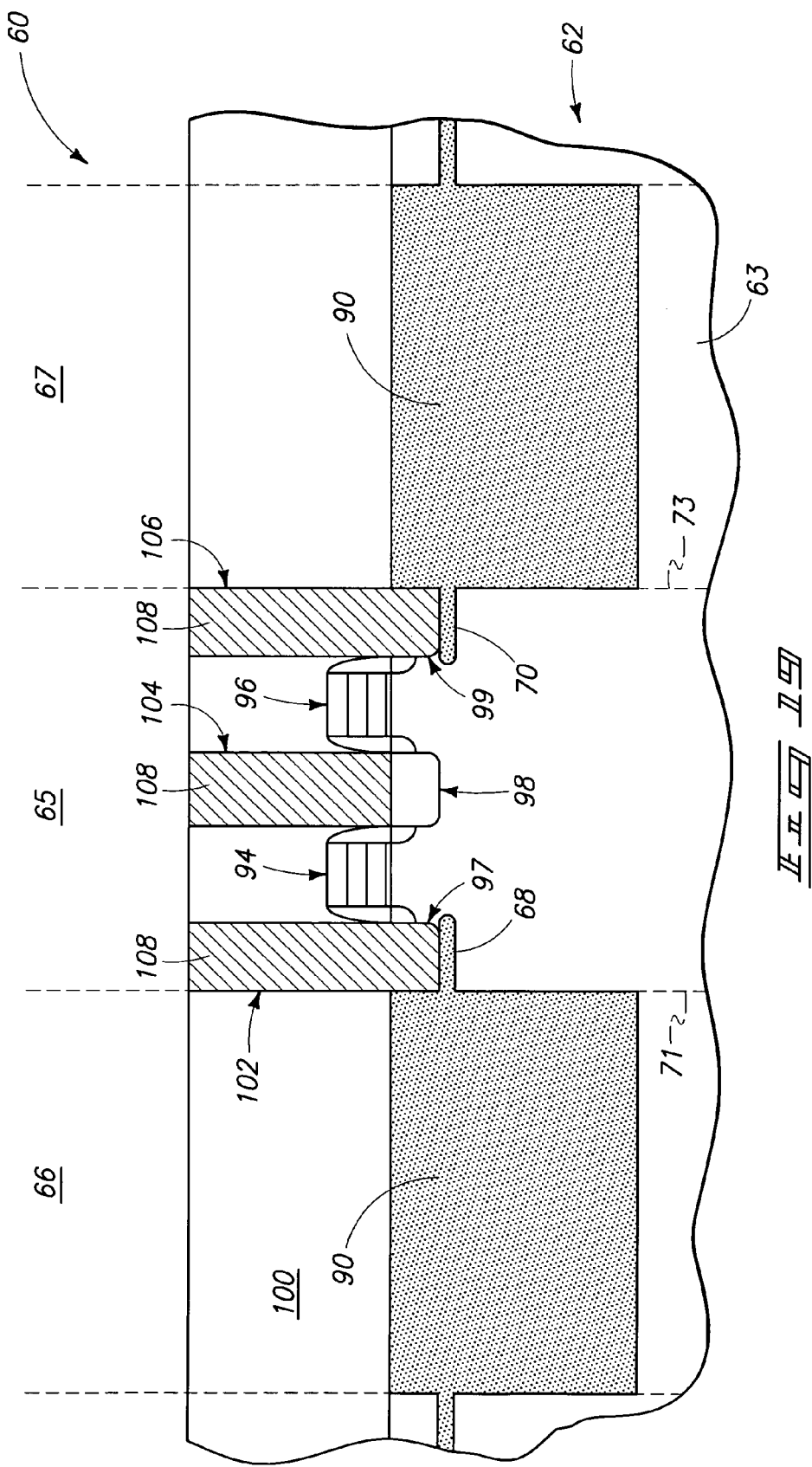
FIG. 19 is a view of the FIG. 18 substrate fragment at a processing step subsequent to that depicted by FIG. 18.

Referring to FIG. 19, openings 102, 104 and 106 have been formed within insulative layer 100. Openings 102 and 106 have been formed to insulative material 90 received within regions 68 and 70, while an opening 104 has been formed to an outer surface of a shared source/drain region received between gate constructions 94 and 96. Conductive metal 108 has been formed within each of openings 102, 104 and 106.

Figure 20:
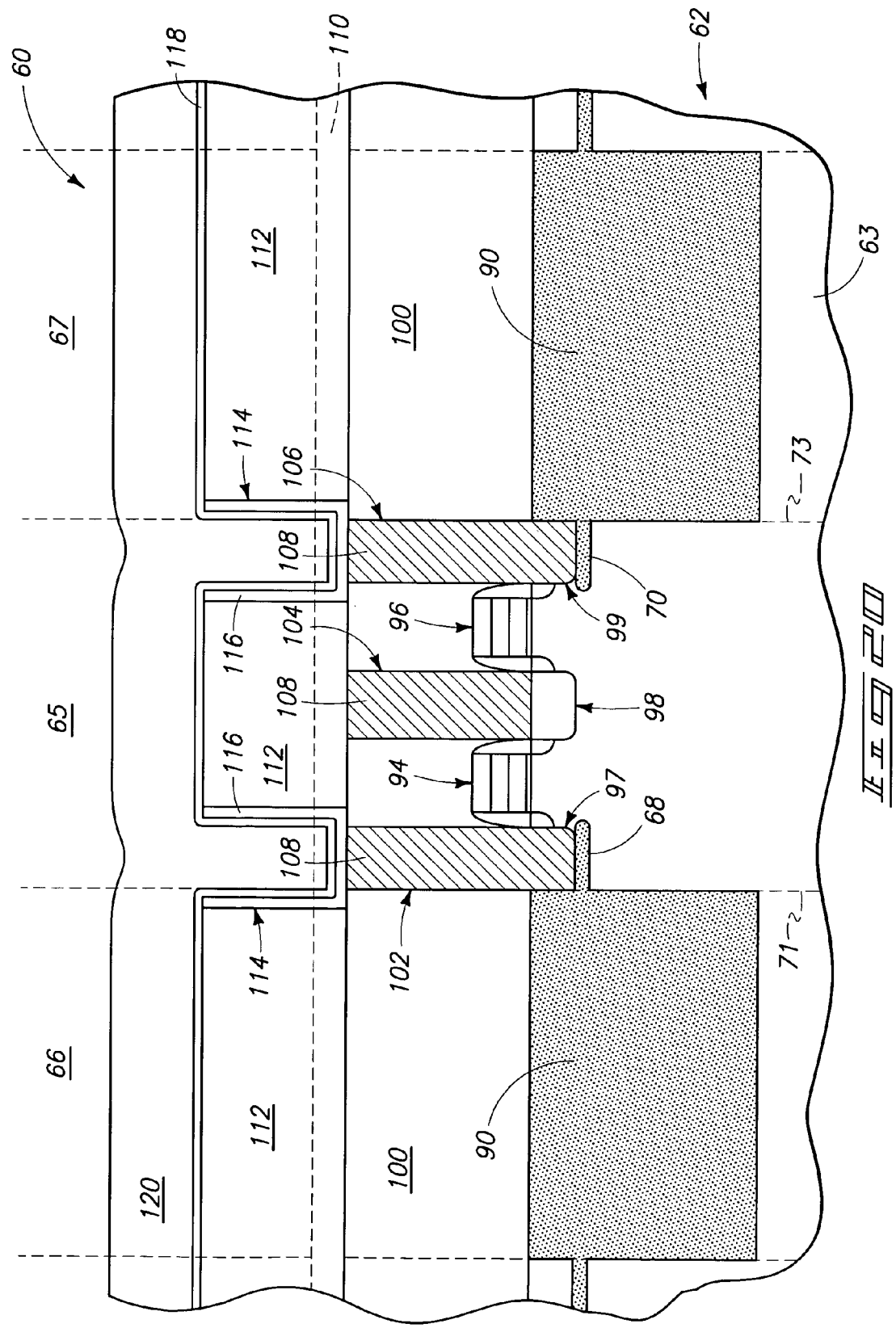
FIG. 20 is a view of the FIG. 19 substrate fragment at a processing step subsequent to that depicted by FIG. 19.
Figure 11:
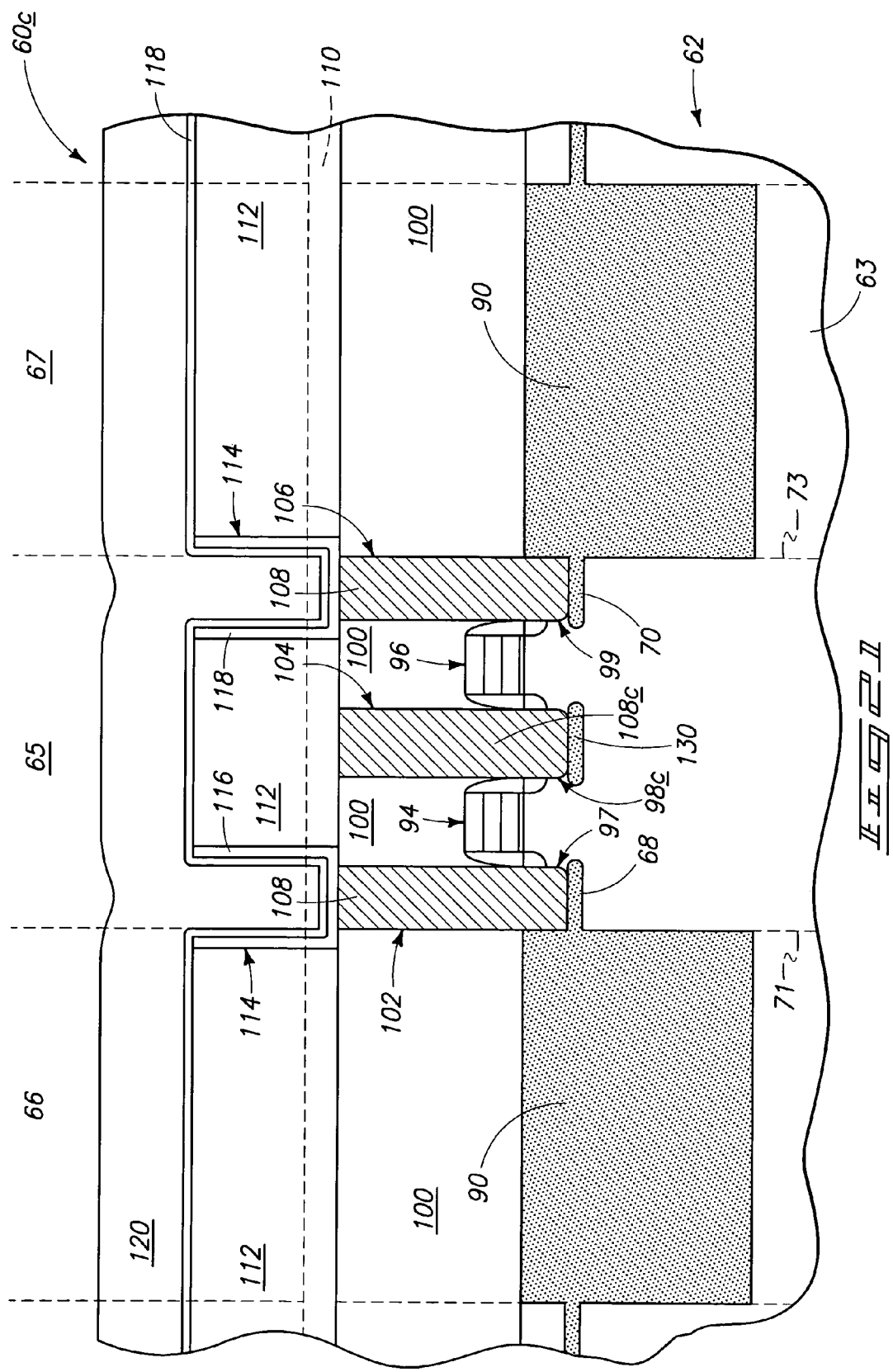

Referring to FIG. 20, the FIG. 19 substrate has been processed in the depicted embodiment to form a pair of DRAM memory cells, particularly buried digit line DRAM memory cells. Dashed outline 110 diagrammatically depicts a digit line which would be in electrical connection with conductive metal 108 in opening 104, and which would include an extension or otherwise be received out of plane of the page upon which FIG. 20 lies. Another insulative dielectric layer 112 has been formed over dielectric layer 100 and bit line 110. Capacitor storage node openings 114 have been formed therein. Conductive capacitor storage electrodes 116 have been formed within openings 114. A capacitor dielectric layer 118 has been deposited thereover, as well as a conductive capacitor cell electrode 120 deposited over capacitor dielectric layer 118.

By way of example only, such depicts DRAM circuitry in the depicted example comprised of two memory cells. One memory cell is comprised of the field effect transistor comprising word line/gate construction 94, the capacitor overlying conductive metal 108 within opening 102, and bit line 110. A second memory cell is comprised of field effect transistor gate/word line 96, the capacitor overlying conductive material 108 within opening 106, and bit line 110.

By way of example only, an alternate embodiment substrate fragment 60c is depicted in FIG. 21. Like numerals to the embodiment of FIGS. 13-20 have been utilized where appropriate, with differences being indicated with the suffix "c" or with different numerals. In FIG. 21, conductive metal 108c received within opening 104 has been fabricated to extend to a buried insulative layer/region 130.

The invention contemplates a DRAM circuit memory cell independent of the method of fabrication, and accordingly, independent of the above-described preferred embodiment methods for fabricating a DRAM circuit memory cell. In one exemplary embodiment, a DRAM circuit memory cell comprises a substrate comprising semiconductive material, for example substrate 62 comprising material 63. In one preferred embodiment, the substrate comprises bulk monocrystalline silicon. A bit line is formed over the substrate, for example bit line 110 formed over substrate 62. A capacitor is formed over the substrate, with the capacitor comprising a storage electrode and a cell electrode. By way of example only, either of the capacitors depicted in FIG. 20 are exemplary such capacitors. In one preferred embodiment, the capacitor storage electrode, for example material 116, is void of conductively doped semiconductive material, although conductively doped semiconductive material for electrode 116 is also contemplated.

A field effect transistor comprising a word line is received over the substrate for example gate transistor/word line 94 associated with the left illustrated capacitor. The field effect transistor comprises one source/drain region in electrical connection with the capacitor storage electrode (i.e., source/drain region 97) and another source/drain region in electrical connection with the bit line (i.e., source/drain region 98).

The substrate comprises an insulative layer received beneath the one source/drain region (i.e., material 90 within region 68). In one exemplary preferred embodiment, the insulative layer comprises silicon dioxide in one exemplary preferred embodiment, the insulator layer is not received beneath the channel region (i.e., material 90 within void 86 is not received beneath the conductive portion of gate construction 94, and thereby, not beneath the channel region of the field effect transistor of the memory cell). In one implementation, the insulator layer does not extend to beneath the another source/drain region (i.e., insulative material 90 within region 68 does not extend to beneath the another source/drain region 98 in FIG. 20).

The one source/drain region comprises conductive metal which extends from the insulative layer to the capacitor storage electrode. For example in the FIG. 20 embodiment, source/drain region 97 is comprised of conductive metal 108 which extends from insulative layer 90/68 to capacitor storage electrode 116 lying thereover. In one preferred embodiment, the conductive metal comprises a mixture of a) a metal compound, and b) elemental form metal or an alloy of elemental metals. By way of example only, a preferred example is metal silicide constituting the source/drain region within semiconductive material 63, and elemental form tungsten lying thereover and extending to the capacitor storage electrode.

In one implementation, and independent of whether the one source/drain region comprises conductive metal extended from the insulative layer to the capacitor storage electrode, the invention contemplates a DRAM circuit memory cell wherein the another source/drain region comprises conductive metal which extends from the insulative layer to the bit line. For example and by way of example only, FIG. 21 depicts such an another source/drain region 98c comprising conductive metal material 108c which extends from an insulative layer 130 received beneath source/drain region 98c to bit line 110. Other attributes are preferably as described just above. Of course, the invention also contemplates a combination of the another source/drain region comprising conductive metal which extends from an insulative layer thereunder to the bit line, with the one source/drain region comprising conductive metal extending from an insulative layer thereunder to the capacitor storage electrode, also for example as shown in FIG. 21.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A DRAM circuit memory cell comprising:
a substrate comprising semiconductive material;
a bit line over the substrate;
a capacitor over the substrate, the capacitor comprising a storage electrode and a cell electrode;
a field effect transistor comprising a word line received over the substrate, the field effect transistor comprising one source/drain region in electrical connection with the capacitor storage electrode and another source/drain region in electrical connection with the bit line;
the substrate comprising an insulative layer received underneath the one source/drain region; and
the one source/drain region comprising conductive metal extending from the insulative layer to the capacitor storage electrode.

2. The memory cell of claim 1 wherein the substrate comprises bulk monocrystalline silicon, the field effect transistor comprising a channel region formed within the bulk monocrystalline silicon.

3. The memory cell of claim 1 wherein the capacitor storage electrode is void of conductively doped semiconductive material.

4. The memory cell of claim 1 wherein the capacitor storage electrode comprises conductively doped semiconductive material.

5. The memory cell of claim 1 wherein the conductive metal comprises elemental-form metal or an alloy of elemental metals, including a mixture thereof.

6. The memory cell of claim 1 wherein the conductive metal comprises a metal compound.

7. The memory cell of claim 6 wherein the conductive metal compound comprises a metal silicide.

8. The memory cell of claim 1 wherein the conductive metal comprises a mixture of a) a metal compound, and b) elemental-form metal or an alloy of elemental metals.

9. The memory cell of claim 8 wherein the conductive metal compound comprises a metal silicide, and the mixture comprises elemental-form tungsten.

10. The memory cell of claim 1 wherein the insulative layer comprises silicon dioxide.

11. The memory cell of claim 1 wherein the field effect transistor comprises a channel region, the insulative layer not being received beneath the channel region.

12. The memory cell of claim 1 wherein the substrate comprises bulk monocrystalline silicon, the field effect transistor comprising a channel region formed the within the bulk monocrystalline silicon, the insulative layer not being received beneath the channel region.

13. The memory cell of claim 1 wherein the insulative layer does not extend to beneath the another source/drain region.

14. A DRAM circuit memory cell comprising:
a substrate comprising semiconductive material;
a bit line over the substrate;
a capacitor over the substrate, the capacitor comprising a storage electrode and a cell electrode:
a field effect transistor comprising a word line received over the substrate, the field effect transistor comprising one source/drain region in electrical connection with the capacitor storage electrode and another source/drain region in electrical connection with the bit line;
the substrate comprising an insulative layer received beneath the another source/drain region; and
the another source/drain region comprising conductive metal which extends from the insulative layer to the bit line.

15. The memory cell of claim 14 further comprising an insulative layer received beneath the one source/drain region, wherein the one source/drain region comprises conductive metal extending from the insulative layer received therebeneath to the capacitor storage electrode.

16. The memory cell of claim 15 wherein the insulative layer received beneath the one source/drain region is spaced from the insulative layer received beneath the another source/drain region.

17. The memory cell of claim 14 wherein the substrate comprises bulk monocrystalline silicon, the field effect transistor comprising a channel region formed within the bulk monocrystalline silicon.

18. The memory cell of claim 14 wherein the conductive metal comprises elemental-form metal or an alloy of elemental metals, including a mixture thereof.

19. The memory cell of claim 14 wherein the conductive metal comprises a metal compound.

20. The memory cell of claim 19 wherein the conductive metal compound comprises a metal silicide.

21. The memory cell of claim 14 wherein the conductive metal comprises a mixture of a) a metal compound, and b) elemental-form metal or an alloy of elemental metals.

22. The memory cell of claim 21 wherein the conductive metal compound comprises a metal silicide, and the mixture comprises elemental-form tungsten.

23. The memory cell of claim 14 wherein the insulative layer comprises silicon dioxide.

24. The memory cell of claim 14 wherein the field, effect transistor comprises a channel region, the insulative layer not being received beneath the channel region.

25. The memory cell of claim 14 wherein the substrate comprises bulk monocrystalline silicon, the field effect transistor comprising a channel region formed within the bulk monocrystalline silicon, the insulative layer not being received beneath the channel region.

* * * * *

UNITED STATES PATENT AND TRADEMARK OFFICE
CERTIFICATE OF CORRECTION

PATENT NO. : 7,276,752 B2 Page 1 of 1
APPLICATION NO. : 11/255613
DATED : October 2, 2007
INVENTOR(S) : Sandhu et al.

It is certified that error appears in the above-identified patent and that said Letters Patent is hereby corrected as shown below:

On the Title page, item (57), under "Abstract", in column 2, line 6, delete "implantion" and insert -- implantation --, therefor.

In column 10, line 34, in Claim 12, after "formed" delete "the".

In column 12, line 3, in Claim 24, after "field" delete ",".

Signed and Sealed this

Eleventh Day of December, 2007

JON W. DUDAS
*Director of the United States Patent and Trademark Office*